(12) United States Patent
Van Der Rijst

(10) Patent No.: US 6,705,376 B2
(45) Date of Patent: Mar. 16, 2004

(54) DEVICE FOR SUPPLYING ELECTRONIC COMPONENTS TO A PICK-UP POSITION

(75) Inventor: Ernst Paul Van Der Rijst, Heelsum (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 39 days.

(21) Appl. No.: 10/181,083

(22) PCT Filed: Nov. 8, 2001

(86) PCT No.: PCT/EP01/13046

§ 371 (c)(1),
(2), (4) Date: Jul. 12, 2002

(87) PCT Pub. No.: WO02/41681

PCT Pub. Date: May 23, 2002

(65) Prior Publication Data

US 2003/0010790 A1 Jan. 16, 2003

(51) Int. Cl.[7] .................................................. B65H 5/28
(52) U.S. Cl. ........................ 156/584; 156/344; 221/25; 221/79; 221/87; 414/511; 414/416
(58) Field of Search ................................ 156/344, 584; 221/25, 72, 73, 79, 87; 226/120, 139; 414/411, 416, 425

(56) References Cited

U.S. PATENT DOCUMENTS 5,299,902 A * 4/1994 Fujiwara et al. ....... 414/416.01
5,515,600 A * 5/1996 Iwasaki et al. ................ 29/740

FOREIGN PATENT DOCUMENTS

EP 0496586 1/1996 .......... H05K/13/02

* cited by examiner

Primary Examiner—Mark A. Osele
(74) Attorney, Agent, or Firm—Aaron Wexler

(57) ABSTRACT

The invention relates to an apparatus for supplying electronic components to a pick-up position, for example for automatically picking up and mounting said components on a printed circuit board by means of a mounting device, at least two supply carriers (8a,8b) being movable towards said pickup-position (7) by transport means, which carriers are each provided with recessed portions (9a,9b) containing respective electronic components, while said recessed portions are shielded off by means of a covering (10a,10b) which is removable during use. The invention aims to provide a tape-feeder of this kind with multiple tape supplies, wherein the mounting device can handle more electronic components whilst maintaining the width of the apparatus. The apparatus according the invention is characterized in that the supply carriers (8a,8b) overlap each other in lateral direction near the pick-up position (7), but such that at least the recessed portions (9a,9b) of an overlapped supply carrier (8a,8b) are freely accessible to the component mounting device in the pickup position (7).

1 Claim, 2 Drawing Sheets

DEVICE FOR SUPPLYING ELECTRONIC COMPONENTS TO A PICK-UP POSITION

The invention relates to a device for supplying electronic components to a pick-up position, for example for the purpose of an automatic picking-up of the components by a placement machine and placing them on a printed circuit board, wherein at least two supply carriers are movable towards said pick-up position, said supply carriers being each provided with recessed portions each accommodating an electronic component, which recessed portions are shielded off by means of a covering which is removable during operation.

Such devices are also called "tape feeders" and are used for supplying large numbers of, usually small electronic components to a placement machine, which picks up the components and then places them on a printed circuit board. The electronic components are for this purpose packed in a supply carrier or tape which is unwound from a reel, and the components can be picked up by the placement machine after a covering foil has been removed.

Tape feeders with several tape transports (two in this case) in one housing are known from, for example, European patent no. 0 496 586. In this publication, two supply reels are accommodated in the housing, each with a wound supply carrier with packed electronic components. During operation, the two supply carriers are conducted next to one another to a pick-up position where the two types of electronic components can be taken up by one placement machine after the two covering foils have been removed.

This renders it possible to process two or more types of electronic components supplied next to one another by means of one placement machine.

In another known embodiment, the two (or more) supply carriers are located one behind the other. This has the disadvantage that the placement machine has to perform considerable, time-consuming displacements between the various pick-up positions.

In the embodiment of EP-B-0 496 586, the gain in constructional space is limited: the total width of the device is at least equal to the total widths of the supply carriers situated next to one another. If several tape transports are placed next to one another, the placement machine still has to perform time-consuming displacements in lateral direction, whereby the quantity of picked-up and placed electronic components per unit time is limited.

The invention has for its object to counteract the above disadvantage and to provide a tape feeder with several tape transports in which the placement machine can process more than one electronic component type while the width of the device remains unchanged.

According to the invention, the device is characterized in that the supply carriers partly overlap in lateral direction adjacent the pick-up position, but such that at least the recessed portions of an overlapped supply carrier are freely accessible to the component placement machine in the pick-up position.

This stepped or staggered mounting of the various supply carriers in the housing renders it possible to achieve a further gain in constructional space. The total width of the device is smaller now than the sum of the widths of the supplied carriers. Since the pick-up positions of the supply carriers are closer together, the placement machine can handle the same number of electronic components with smaller displacements between the pick-up positions.

Alternatively, a placement machine can serve more pick-up positions across the same original width thanks to the saving in space, which increases the speed and efficiency of the tape feeder and the placement machine.

The invention will now be explained in more detail below with reference to a drawing, in which.

Figure 1:
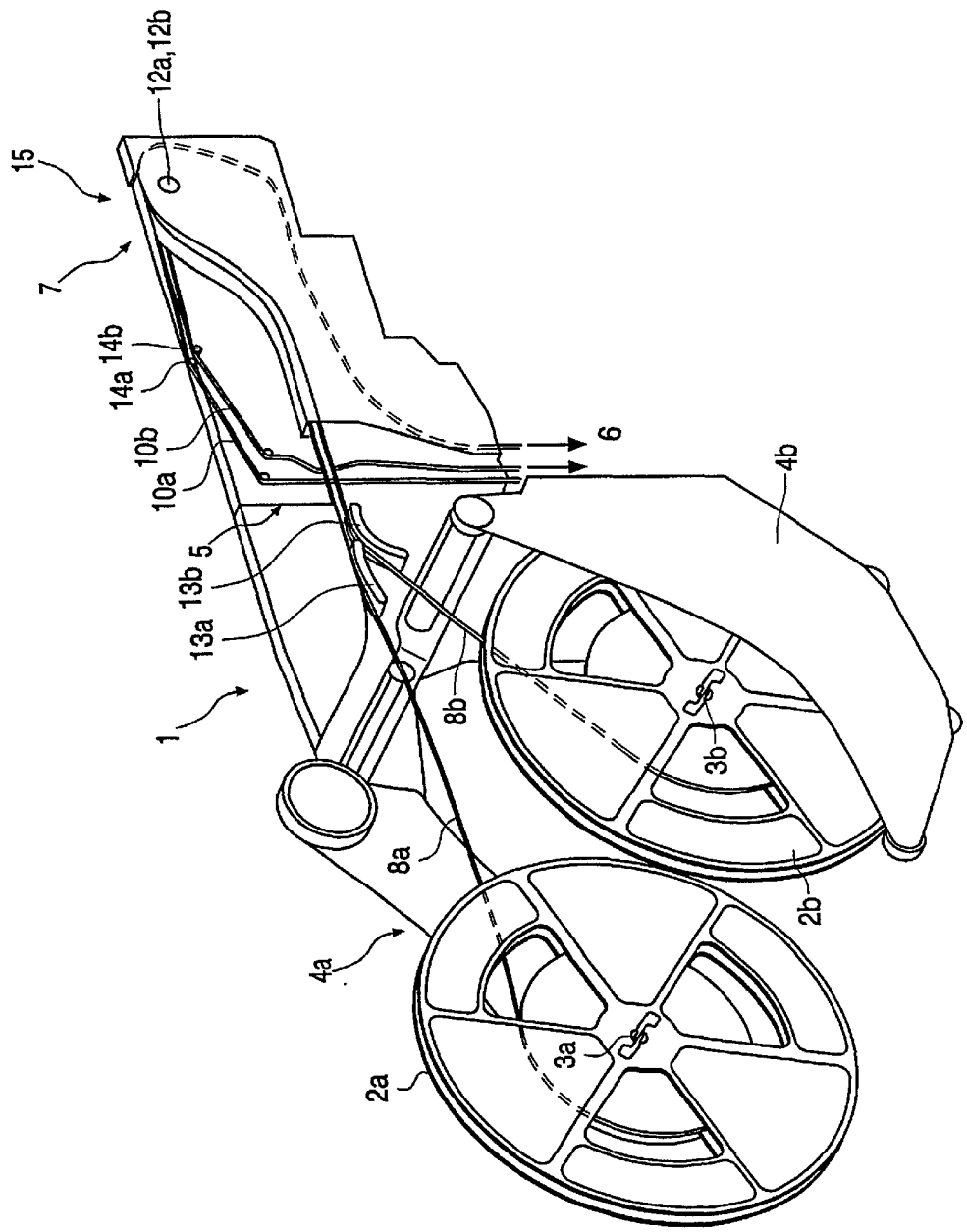
FIG. 1 shows an embodiment of a device according to the invention.

The device for supplying electronic components to a pick-up position as shown in FIG. 1 has a housing 1 in which several—two in this embodiment—supply lines 8a and 8b for electronic components are present. The supply lines are constructed as supply carriers 8a, 8b which are each provided with a plurality of recessed portions 9a (9b) (see FIGS. 2a–c) which are generally situated at regular distances from one another. An electronic component (not shown) is held in each recessed portion 9a (9b), for example a resistor, a capacitor, an integrated circuit, or some other component having a certain electronic specification. A removable covering is furthermore provided on the supply carrier 8a (8b), for example an adhesive foil or tape 10a (10b), which closes off the recessed portions 9a (9b) and the electronic components accommodated therein. The covering 10a (10b) is removable from the supply carrier 8a (8b), as will be explained in more detail further below, so that the electronic components are freely accessible in the recessed portions 9a (9b).

The supply carriers 8a and 8b in this embodiment are each wound around a supply reel 2a (2b) for the supply of said electronic components to the pick-up position. The two reels 2a (2b) are freely rotatable about their axes 3a (3b) in a holder 4a (4b). Each supply carrier 8a (8b) is provided with a track of regularly spaced perforations 11a (11b) which are situated alongside the recessed portions 9a (9b) and which co-operate during operation with a sprocket (not shown) which is present in the housing, which can be driven, and of which only the shaft 12a (12b) is depicted. It is alternatively possible, however, to use other transport mechanisms, for example operating by means of a friction wheel or by means of an intermittent reciprocal movement.

The two supply carriers 8a (8b) are unwound from the reel 2a (2b) by such transport means and conducted over one or several guides 13a (13b) so as to be introduced into the device at the location of reference numeral 5, such that the supply carrier 8a is present above the supply carrier 8b. The two supply carriers 8a and 8b are conducted through the device to a pick-up position 7 by means of the transport wheels having shafts 12a, 12b and leave the device at the location of reference numeral 6.

The device is further provided with means 14a and 14b which during operation take the coverings 10a, 10b from the respective supply carriers 8a, 8b. The two coverings, for example adhesive tapes 10a and 10b are removed as waste material from the device via various guides adjacent reference numeral 6.

After the supply carriers 8a and 8b situated one above the other have been moved into the device adjacent reference numeral 5 and towards the pick-up position 7, and the two adhesive tapes 10a and 10b have been removed, means which guide the two supply carriers 8a and 8b through the device ensure that the supply carriers will overlap only partly in lateral direction. This is in contrast to location 5, where the supply carrier 8a lies fully above the supply carrier 8b in lateral direction.

As the enlarged detail sketch 2a of FIG. 1 shows, the supply carrier 8a overlaps the supply carrier 8b only partly, i.e. such that at least the recessed portions 9b of the overlapped supply carrier 8b are freely accessible to the component placement machine at the area of the pick-up position.

Figure 2A:
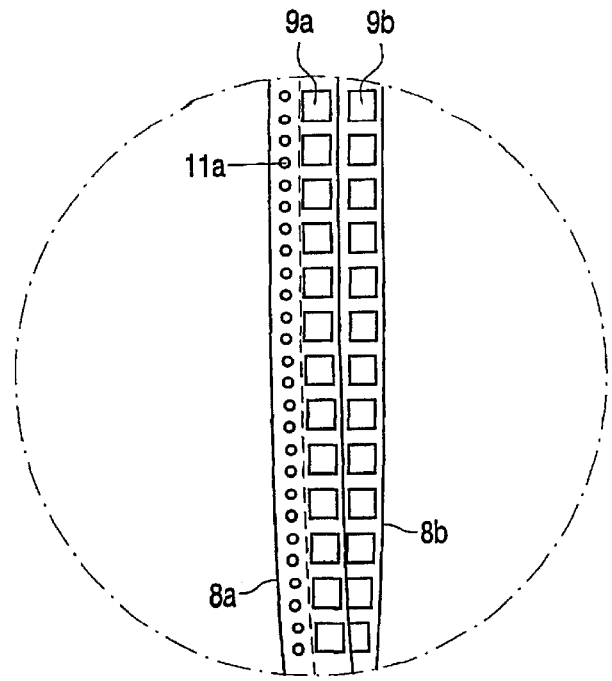
FIGS. 2a to 2c are detailed views of the supply carriers adjacent the pick-up position.

As FIG. 2a clearly shows, the recessed portions 9a of the supply carrier 8a are at least partly above the perforation track 11b of the supply carrier 8b situated immediately next to the supply carrier 8a.

Figure 2B:
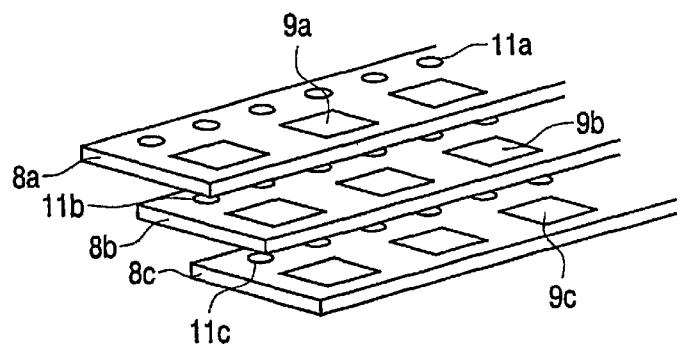
Figure 2C:
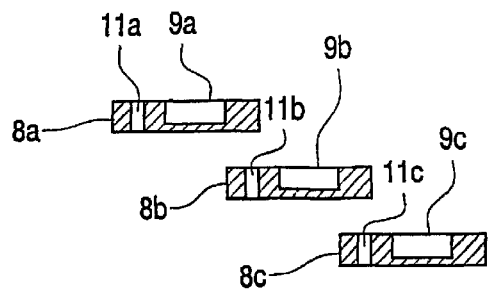

FIGS. 2b and 2c show the same situation from two different points of view for three supply carriers 8a, 8b, and 8c.

The supply carriers 8a and 8b partly overlapping and containing exposed electronic components after the removal of the two adhesive tapes 10a and 10b are fed to the pick-up position 7. A placement machine referenced 15 and known per se is arranged in the pick-up position 7, which machine can now pick up and displace the exposed electronic components, for example for placing the components on a printed circuit board.

It will be obvious that, in contrast to the prior art devices, in which the various supply carriers are conducted towards the pick-up position lying next to one another in the same plane, and in which accordingly the total width of the device is at least equal to the total widths of the supply carriers lying next to one another, a significant saving in constructional space is obtained with the device according to the invention. The total width of the device is now smaller than the total widths of the supply carriers 8a and 8b fed. Since the pick-up positions for each supply carrier lie closer together, the placement machine 15 can handle the same number of electronic components with smaller displacements between the pick-up positions 7. The processing speed of the placement machine, i.e. the number of picked-up and placed electronic components per unit time, is increased.

On the other hand, the saving in space means that the placement machine 15 can handle more pick-up positions 7 over the same original width, which causes the speed and effectivity of the device according to the invention and of the placement machine 15 to increase still further.

What is claimed is:

1. A device for supplying electronic components to a pick-up position, for example for the purpose of an automatic picking-up of the components by a placement machine and placing them on a printed circuit board, wherein at least two supply carriers are movable towards said pick-up position, said supply carriers being each provided with recessed portions each accommodating an electronic component, which recessed portions are shielded off by means of a covering which is removable during operation, characterized in that the supply carriers partly overlap in lateral direction adjacent the pick-up position, but such that at least the recessed portions of an overlapped supply carrier are freely accessible to the component placement machine in the pick-up position.

* * * * *